(12) United States Patent
Carfore et al.

(10) Patent No.: US 12,101,610 B2
(45) Date of Patent: Sep. 24, 2024

(54) HIGH ACOUSTIC OVERLOAD POINT RECOVERY APPARATUS AND METHOD

(71) Applicant: Qualcomm Technologies Inc., San Diego, CA (US)

(72) Inventors: Michael Carfore, North Quincy, MA (US); Tomer Saraf, Jamaica Plain, MA (US)

(73) Assignee: QUALCOMM Incorporated, San Diego, CA (US)

( * ) Notice: Subject to any disclaimer, the term of this patent is extended or adjusted under 35 U.S.C. 154(b) by 44 days.

(21) Appl. No.: 17/741,215

(22) Filed: May 10, 2022

(65) Prior Publication Data

US 2022/0360894 A1 Nov. 10, 2022

Related U.S. Application Data

(60) Provisional application No. 63/186,448, filed on May 10, 2021.

(51) Int. Cl.
*H04R 3/00* (2006.01)
*H10N 30/30* (2023.01)

(52) U.S. Cl.
CPC ............ *H04R 3/002* (2013.01); *H04R 3/007* (2013.01); *H10N 30/302* (2023.02); *H04R 2201/003* (2013.01)

(58) Field of Classification Search
None
See application file for complete search history.

(56) References Cited

U.S. PATENT DOCUMENTS

| 2014/0010374 | A1 | 1/2014 | Kasai et al. | |
| 2015/0124981 | A1 | 5/2015 | Veneri et al. | |
| 2016/0087596 | A1* | 3/2016 | Yurrtas | H04R 1/04 381/111 |
| 2018/0352330 | A1 | 12/2018 | Mucha et al. | |
| 2020/0059214 | A1 | 2/2020 | Perrott et al. | |
| 2020/0071157 | A1* | 3/2020 | Yang | B81B 7/0061 |

OTHER PUBLICATIONS

Author Unknown, "Analog Engineer's Circuit: Amplifiers; Window comparator circuit", Texas Instruments, SBOA221A—Jan. 2018—Revised Feb. 2019 (4 pages).
Clayton, G.B., et al., "Operational Amplifiers," BH Newnes, Third Edition, 1995, pp. 10-11; 235-244; and 295-297 (11 pages).
International Searching Authority, International Search Report for International Application No. PCT/US22/28596, dated Aug. 18, 2022 together with the Written Opinion of the International Searching Authority, 17 pages.

* cited by examiner

*Primary Examiner* — Kenny H Truong
(74) *Attorney, Agent, or Firm* — QUALCOMM Incorporated; Espartaco Diaz Hidalgo

(57) ABSTRACT

Illustrative embodiments enable a MEMS transducer to quickly recover from, acoustic overload events by quickly resetting signal processing circuitry downstream from a MEMS transducer. An acoustic overload sensor detects occurrence of an acoustic overload event, and triggers a reset circuit to operate a set of switches to rapidly drain charge from a corresponding set of capacitances within the transducer, or within the signal processing circuitry, thereby resetting the signal processing circuitry more rapidly than would occur if said transducer or circuitry were allowed to recover on its own.

13 Claims, 7 Drawing Sheets

HIGH ACOUSTIC OVERLOAD POINT RECOVERY APPARATUS AND METHOD

RELATED APPLICATIONS

This application claims priority to U.S. Provisional Application No. 63/186,448, filed May 10, 2021 and titled "High Acoustic Overload Point Recovery Apparatus and Method" and naming Michael Carfore as inventor The disclosures of each of the foregoing applications are incorporated herein, in their entireties, by reference.

TECHNICAL FIELD

Illustrative embodiments of the generally relate to sensors and, more particularly, various embodiments of the invention relate to MEMS acoustic sensors.

BACKGROUND ART

High Acoustic Overload Point (AOP) events are very loud (for microphones), or very large acceleration (for accelerometers) or very high rotations (for gyroscopes) events that overload the piezoelectric capacitive MEMS sensor. These events cause the front-end amplifier to clip and possibly get stuck in this clipped state. During this clipped state, no signal will get through, rendering the microphone/accelerometer/gyroscopes useless until the amplifier can recover, which due to the dynamics involved, may take multiple seconds.

SUMMARY OF VARIOUS EMBODIMENTS

System Embodiments

In accordance with one embodiment, a transducer signal processing apparatus includes:
  (1) a signal processing circuit having an input interface configured to receive a transducer output signal from a transducer output interface, and an output interface configured to produce a system output signal produced from the transducer output signal; and also includes
  (2) an overload sensor circuit having an overload sensor input interface to receive the transducer output signal, and configured to detect an acoustic overload event, and an overload sensor output interface configured to provide an acoustic overload signal in response to detection of an acoustic overload; and
  (3) a system reset circuit configured to reset the signal processing circuit in response to detection of an acoustic overload event, the system reset circuit having an input interface coupled to the overload sensor output interface.

In some embodiments, the overload sensor circuit is configured to detect an acoustic overload event by detecting that the transducer output signal indicates an acoustic overload. For example, in some embodiments the overload sensor circuit is configured to detect an acoustic overload event by detecting that the transducer output signal exceeds a pre-determined acoustic overload threshold amplitude. In other embodiments, the overload sensor circuit is configured to detect an acoustic overload event by detecting that the transducer output signal is clipped.

The signal processing apparatus may have an acoustic overload point because the transducer providing the transducer output signal has a transducer acoustic overload point, and/or the signal processing circuit has an acoustic overload point (which may be referred-to as a "signal chain acoustic overload point"). Consequently, in some embodiments, signal processing circuit has a signal chain acoustic overload point, and wherein the acoustic overload threshold is pre-determined to be at or below the signal chain acoustic overload point, and to be lower than an acoustic overload point of the transducer. In other embodiments, the transducer has a transducer acoustic overload point, and the acoustic overload threshold is predetermined to be at or below the transducer acoustic overload point. In some embodiments, the transducer has a transducer acoustic overload point amplitude, and the overload sensor circuit is configured to detect an acoustic overload event by determining that the transducer output signal exceeds the transducer acoustic overload point amplitude.

In some embodiments of the transducer signal processing apparatus, the signal processing circuit includes:
  (a) A charge amplifier having a set of capacitors, each capacitor of the set of capacitors disposed to charge in response to receipt, by the signal processing circuit, of the transducer output signal; and
  (b) A set of switches, each switch having an open configuration and a closed configuration. Each switch of the set of switches is in electrical parallel to a corresponding capacitor from the set of capacitors, and is coupled to allow said corresponding capacitor to discharge when said switch is in a closed configuration.

Each switch of the set of switches is coupled to the system reset circuit and controllable by the system reset circuit into its closed configuration.

In some such embodiments, the system reset circuit includes a timer in control communication with the acoustic overload detector and configured to control each switch of the set of switches into its respective closed configuration for a pre-determined period of time in response to receipt, at the system reset circuit from the overload sensor circuit, of an acoustic overload signal.

In some embodiments, the signal processing circuit includes:
  an amplifier having an amplifier input interface operably coupled to receive the transducer output signal; and
  a set of bias resistors, each bias resistor of the set of bias resistors electrically coupled between the amplifier input interface and a bias voltage source.

For each such bias resistor, the system includes a drain path that includes:
  a drain resistor, the drain resistor having an electrical resistance less than a corresponding bias resistor, and
  a drain switch in electrical series with the drain resistor, the drain switch controllably configurable between an open configuration and a closed configuration, the drain switch in control communication with the system reset circuit to receive a control signal from the system reset circuit to controllably configure the drain switch into one of the open configuration, and in response to an overload event into the closed configuration.

Each such drain is path electrically coupled between the signal processing circuit input interface and the bias voltage source; such that:
  when the drain switch is in its closed configuration, the drain path presents a low-impedance discharge path, in electrical parallel to its corresponding bias resistor, between the transducer and bias voltage source, and
  when the drain switch is in its open configuration, the drain path presents a high impedance path between the transducer and bias voltage source, said high impedance path having an impedance higher than the impedance of the low-impedance discharge path.

In some embodiments, the transducer output signal is a differential signal produced from a first transducer output terminal and a second transducer output terminal, the first transducer output terminal and the second transducer output terminal forming the transducer output interface. In such embodiments, the signal processing circuit includes:

an amplifier having a differential amplifier input interface operably coupled to receive the differential transducer output signal;

a first bias resistor electrically coupled between a first amplifier input terminal and a bias voltage source;

a first drain path including:
  a first drain resistor, the first drain resistor having an electrical resistance less than the first bias resistor, and
  a first drain switch in electrical series with the first drain resistor, the first drain switch controllably configurable between an open configuration and a closed configuration, the first drain switch in control communication with the system reset circuit to receive a control signal from the system reset circuit to controllably configure the first drain switch into one of the open configuration, and in response to an overload event into the closed configuration, such that:
  when the first drain switch is in its closed configuration, the first drain path presents a low-impedance first discharge path, in electrical parallel to the first bias resistor, between a first transducer output terminal and the bias voltage source, said first discharge path having a resistance less than the resistance of the first bias resistor, and
  when the first drain switch is in its open configuration, the first drain path presents a high impedance path between the first transducer output terminal and bias voltage source, said high impedance path having an impedance higher than the impedance of the low-impedance discharge path and higher than the resistance of the first bias resistor.

Such an embodiment also includes:

a second bias resistor electrically coupled between a second amplifier input terminal and the bias voltage source;

a second drain path including:
  a second drain resistor, the second drain resistor having an electrical resistance less than the second bias resistor, and
  a second drain switch in electrical series with the second drain resistor, the second drain switch controllably configurable between an open configuration and a closed configuration, the second drain switch in control communication with the system reset circuit to receive a control signal from the system reset circuit to controllably configure the second drain switch into one of the open configuration, and in response to an overload event into the closed configuration, such that:
  when the second drain switch is in its closed configuration, the second drain path presents a low-impedance second discharge path, in electrical parallel to the second bias resistor, between a second transducer output terminal and the bias voltage source, said second discharge path having a resistance less than the resistance of the second bias resistor, and
  when the second drain switch is in its open configuration, the second drain path presents a high impedance path between the second transducer output terminal and bias voltage source, said high impedance path having an impedance higher than the impedance of the low-impedance discharge path and higher than the resistance of the second bias resistor.

In some embodiments, the transducer output signal is a differential signal produced from a first transducer output terminal and a second transducer output terminal, the first transducer output terminal and the second transducer output terminal forming the transducer output interface.

In such embodiments, the signal processing circuit includes: a charge amplifier having a differential amplifier input interface forming an inverting input and a non-inverting input, differential amplifier input interface operably coupled to receive the differential transducer output signal, the charge amplifier having:

a first feedback capacitor coupled to the inverting input; and a second feedback capacitor coupled to the non-inverting input.

Such embodiments also include a first drain path coupled in electrical parallel with the first feedback capacitor, the first drain path including a first drain switch controllably configurable between an open configuration and a closed configuration, the first drain switch in control communication with the system reset circuit to receive a control signal from the system reset circuit to controllably configure the first drain switch into one of the open configuration, and in response to an overload event into the closed configuration, such that:

when the first drain switch is in its closed configuration, the first drain path presents a low-impedance first discharge path, in electrical parallel to the first feedback capacitor, said first discharge path having a resistance less than the resistance of the first bias resistor.

Such embodiments also include a second drain path coupled in electrical parallel with the second feedback capacitor, the second drain path including a second drain switch controllably configurable between an open configuration and a closed configuration, the second drain switch in control communication with the system reset circuit to receive the control signal from the system reset circuit to controllably configure the second drain switch into one of the open configuration, and in response to an overload event into the closed configuration, such that:

when the second drain switch is in its closed configuration, the second drain path presents a low-impedance second discharge path, in electrical parallel to the second feedback capacitor, said second discharge path having a resistance less than the resistance of the second bias resistor.

Method Embodiments

Another embodiment includes a method of operating a transducer system having a signal path. The method includes:

detecting an acoustic overload event;

in response to detecting an acoustic overload event, engaging a set of drain paths, each drain path controllably providing a low resistance electrical path to drain charge from a corresponding capacitor in the signal path; and detecting the end of the acoustic overload event, and in response to detecting an end of the acoustic overload event, starting a timer having a pre-determined delay time, the timer asserting a termination signal after passage of the pre-determined delay time, and in response to the termination signal, disengaging the set of drain paths to return the signal path to linear operation.

In some embodiments of the method, detecting an acoustic overload event includes determining that an amplitude of a transducer output signal exceeds a pre-determined threshold.

In some embodiments of the method, engaging a set of drain paths includes, for each drain path, operating a switch into a closed configuration, the switch in parallel to a corresponding capacitance to allow charge to drain from the corresponding capacitance. In some such embodiments, disengaging the set of drain paths includes, for each drain path, operating a switch into an open configuration to prevent charge from draining from the corresponding capacitance.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF ILLUSTRATIVE EMBODIMENTS

Illustrative embodiments enable a MEMS transducer 110 to recover quickly from acoustic overload events by quickly resetting signal processing circuitry downstream from a MEMS transducer. An acoustic overload sensor 300 detects occurrence of an acoustic overload event, and triggers a remedial circuit (which may be referred-to as a "reset circuit") 400 to operate a set of drain switches disposed to drain charge from a corresponding set of capacitances within the transducer 110, and/or within the signal processing circuitry 200, thereby resetting the transducer 110, and/or the signal processing circuitry 200 more rapidly than would occur if said transducer or circuitry were allowed to recover on its own.

Definitions: As used in this description and the accompanying claims, the following terms shall have the meanings indicated, unless the context otherwise requires.

A "set" includes at least one member.

The term "AOP" means "Acoustic Overload Point" of a transducer system. For illustrative embodiments, the AOP of an electret condenser microphone (ECM), for example, is considered to be reached when the distortion of the microphone hits ten percent (10%). Piezoelectric MEMS sensors are highly linear until very high sound pressure levels. Some piezoelectric MEMS can withstand sound pressures as high as 170 dBSPL. Therefore, the Acoustic Overload Point (AOP) on piezoelectric MEMS microphones is typically limited by the voltage rail of signal processing circuits 200 in the system (e.g., a set of ASICs processing transducer output). Thus, in illustrative embodiments the AOP of such a piezoelectric MEMS sensor is considered to be reached when the signal being processed by the system causes the signal processing circuits 200 to produce a nonlinear output, such as for example when said signal causes a circuit of signal processing circuit to reach the voltage rail.

An "AOP event" is the reaching by a transducer system of the transducer system's Acoustic Overload Point.

Figure 1A:
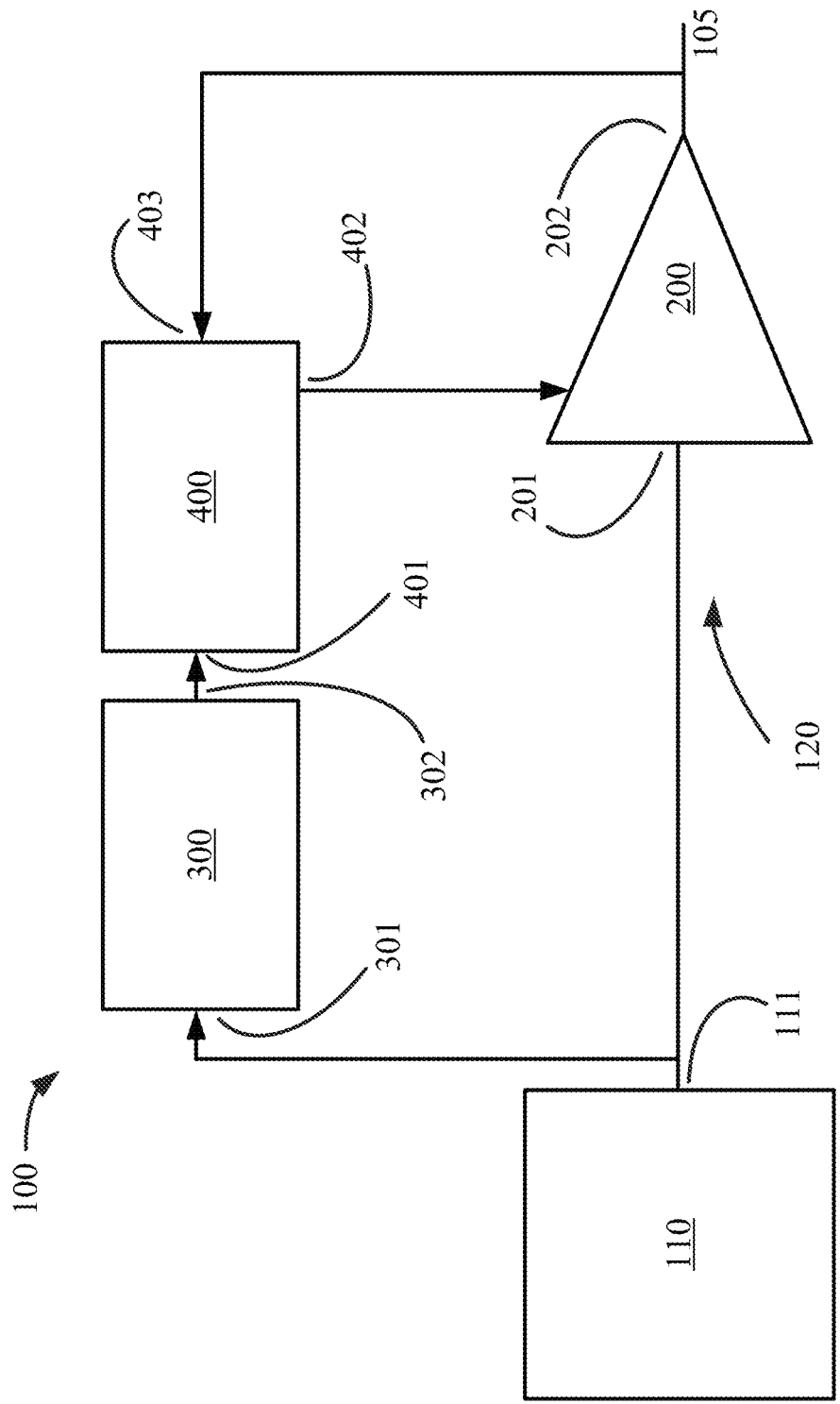
FIG. 1A schematically illustrates an embodiment of a transducer system with reset (or "remedial") circuit.

FIG. 1A schematically illustrates an embodiment of a transducer system 100 with a reset circuit (which may also be referred-to as a "remedial circuit").

The transducer system 100 includes a transducer 110. The transducer 110 may be a microphone, such as a MEMS microphone for example. A MEMS microphone may be a piezoelectric microphone or a capacitor-based microphone such as a condenser microphone, to name but a few examples.

Illustrative embodiments are not limited to microphone transducers, however, and in some embodiments the transducer 110 may be an accelerometer or a gyroscope, for example.

The transducer 110 includes a transducer output interface 111 (which may also be referred-to as a transducer "output port") that provides the output of the transducer 110 as an electrical signal. In some embodiments, the transducer's output signal may be single-ended, and in other embodiments, the transducer's output signal may be differential. The transducer's electrical output signal may be a voltage signal, an electrical charge signal, or a current signal, to name but a few examples. In illustrative embodiments, the transducer's electrical output signal is a linear signal when the transducer is not experiencing an AOP event.

The transducer output port 111 is electrically coupled to an input interface 201 of signal processing circuitry 200. In illustrative embodiments, the signal processing circuitry 200 processes the transducer's electrical output signal and provides a system output signal at output port 202 of signal processing circuitry 200, which is electrically coupled to, and in some embodiments is an electrical node with, the system output port 105.

The system 100 has an Acoustic Overload Point, and in operation, there is a risk that the system 100 reaches its Acoustic Overload Point (in other words, there is a risk that the system will experience an AOP event). The system 100 could reach its Acoustic Overload Point for example because the electrical output of the transducer 100 has become nonlinear, and/or because the signal processing circuitry 200 produces a nonlinear response to the electrical output of the transducer 100 (for example, the signal processing circuitry 200 may produce a clipped output signal).

To address occurrence of an AOP event, the system 100 includes an Acoustic Overload Point detector 300 (or "AOP detector" or "AOP overload sensor") and a reset circuit 400. Together, the AOP detector 300 and the reset circuit 400 may be referred-to as a "recovery" or "remedial" circuit.

In operation of illustrative embodiments, the AOP detector 300 detects occurrence of an AOP event, and provides, to the reset circuit 400, an acoustic overload signal in response to detecting the AOP event. In illustrative embodiments, the AOP detector 300 asserts the acoustic overload signal continuously (e.g., uninterrupted) as long as the AOP event continues.

In some embodiments, the AOP detector 300 comprises a comparator configured to compare the transducer output signal to a pre-determined threshold, and to assert the acoustic overload signal in response to the transducer output signal exceeding the pre-determined threshold. In some embodiments, the comparator is a single-ended comparator, and in some embodiments the comparator is a window comparator. In some embodiments, the AOP detector 300 comprises an analog-to-digital converter ("DAC") coupled to receive the transducer output signal and configured to digitize the transducer output signal into a digitized transducer output signal, and a computer processor is configured to process the digitized transducer output signal to determine whether the transducer output signal has exceeded a pre-determined AOP threshold, and/or whether the transducer output signal is clipped, or is otherwise non-linear.

In response to receipt by the reset circuit 400 of the acoustic overload signal, the reset circuit 400 produces a set of reset signals (or "drain" signals) to the signal processing circuitry 200, which cause the signal processing circuitry 200 to reset, or clear. When reset circuit 400 asserts the set of reset signals, the system may be said to be in "reset" mode, or "reset" configuration. When reset circuit 400 is not asserting the set of reset signals, the system may be said to be in "operational" mode.

In illustrative embodiments, the set of reset signals operate one or more drain switches 233, 238 in the signal processing circuitry 200 to drain charge from a corresponding set of capacitances. In response to the set of reset signals, the signal processing circuitry 200 may operate in a non-linear fashion until said set of reset signals is removed or made inactive.

In illustrative embodiments, the reset circuit 400 asserts the set of reset signals for as long as the AOP detector 300 asserts the acoustic overload signal to the reset circuit 400, and for a pre-determined length of time after termination of the AOP event. Although the reset circuit 400 could stop asserting the set of reset signals (or in other words, could de-assert the set of reset signals) as soon as the AOP detector 300 stops asserting (or de-asserts) the acoustic overload signal, in preferred embodiments, the reset circuit 400 continues to assert the set of reset signals for a pre-determined time after the AOP detector 300 stops asserting (or de-asserts) the acoustic overload signal. For example, in illustrative embodiments, the reset circuit 400 continues to assert the set of reset signals for 40 milliseconds, 50 milliseconds, or 60 milliseconds after the AOP detector 300 stops asserting (or de-asserts) the acoustic overload signal, to name but a few examples. Consequently, in illustrative embodiments, the reset circuit 400 asserts the set of reset signal for a duration including the duration of the AOP event plus a pre-determined length of time after termination of the AOP event.

To those ends, the transducer output port 111 is in electrical communication with a AOP input port 301 on the AOP detector 300 to provide the transducer electrical output signal to the AOP detector 300.

Described alternately, the AOP detector 300 is a circuit configured to produce an overload signal 183, at AOP output port 302, in response to detecting an AOP event. In illustrative embodiments, the overload signal 183 is a binary (or digital) signal having a first state (e.g., logic "1") indicating the detection of an AOP event, and a second state (e.g., logic "0") indicating an absence of an AOP event.

In some embodiments, the AOP detector 300 includes a comparator configured to produce the overload signal 183 (i.e., logic "1" output from the AOP detector 300) in response to output of the transducer 100 exceeding a pre-defined threshold of the AOP detector 300. In some embodiments, in which the transducer 100 has a transducer AOP threshold, the pre-defined threshold of the AOP detector 300 is based on (e.g., is equal to) the transducer AOP threshold. In some embodiments, in which the signal processing circuit 200 has circuit AOP threshold, the threshold of the AOP detector 300 is based on (and may be equal to or less than) the circuit AOP threshold.

In some embodiments, the AOP detector 300 includes an analog-to-digital converter configured to convert output of the transducer to a digital signal, and to produce the overload signal 183 in response to output of the transducer 100 exceeding a pre-defined threshold. In some embodiments, the AOP detector 300 includes a microcontroller programmed to produce the overload signal 183 in response to output of the transducer 100 exceeding a pre-defined threshold.

In some embodiments, the AOP detector 300 and the reset circuit 400 include a microcontroller programmed to produce the overload signal 183 and the set of reset signals. Such a microcontroller may be an ADuc834 microcontroller, or an ADSP-CM432F mixed signal control processor, both available from Analog Devices, Inc., to name but a few examples.

In other embodiments, the AOP detector 300 samples the transducer output signal and detects when that transducer output signal is non-linear. In such embodiments, the AOP detector 300 may include an analog-to-digital converter to convert the transducer output signal to a digital signal, which signal may be referred to as a digitized transducer output signal, and a microprocessor programmed to analyze the digitized transducer output signal to determine when the digitized transducer output signal is nonlinear.

The AOP output port 302 is in electrical communication with remedial input port 401 of the remedial circuit 400, to receive the overload signal 183 from the AOP detector 300. The remedial circuit 400 configured to reset the transducer system 100 in response to receipt at the remedial circuit 400 of the overload signal 183. To that end, in illustrative embodiments, the remedial circuit 400 produces a set of reset signals 184 at a reset circuit output port 402.

Figure 1B:
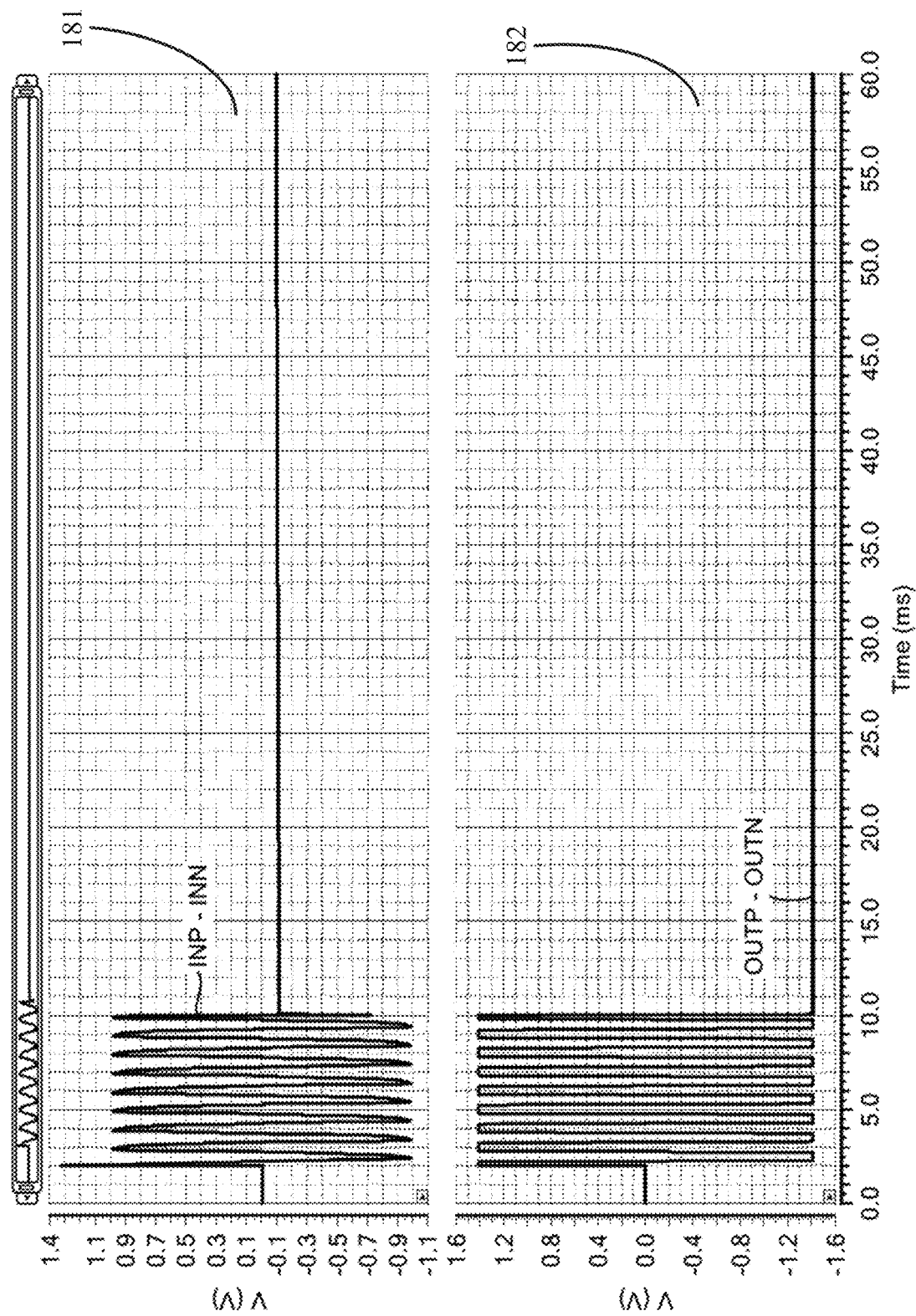
FIG. 1B graphically shows response to AOP event with no recovery circuitry in various embodiments.
Figure 1C:
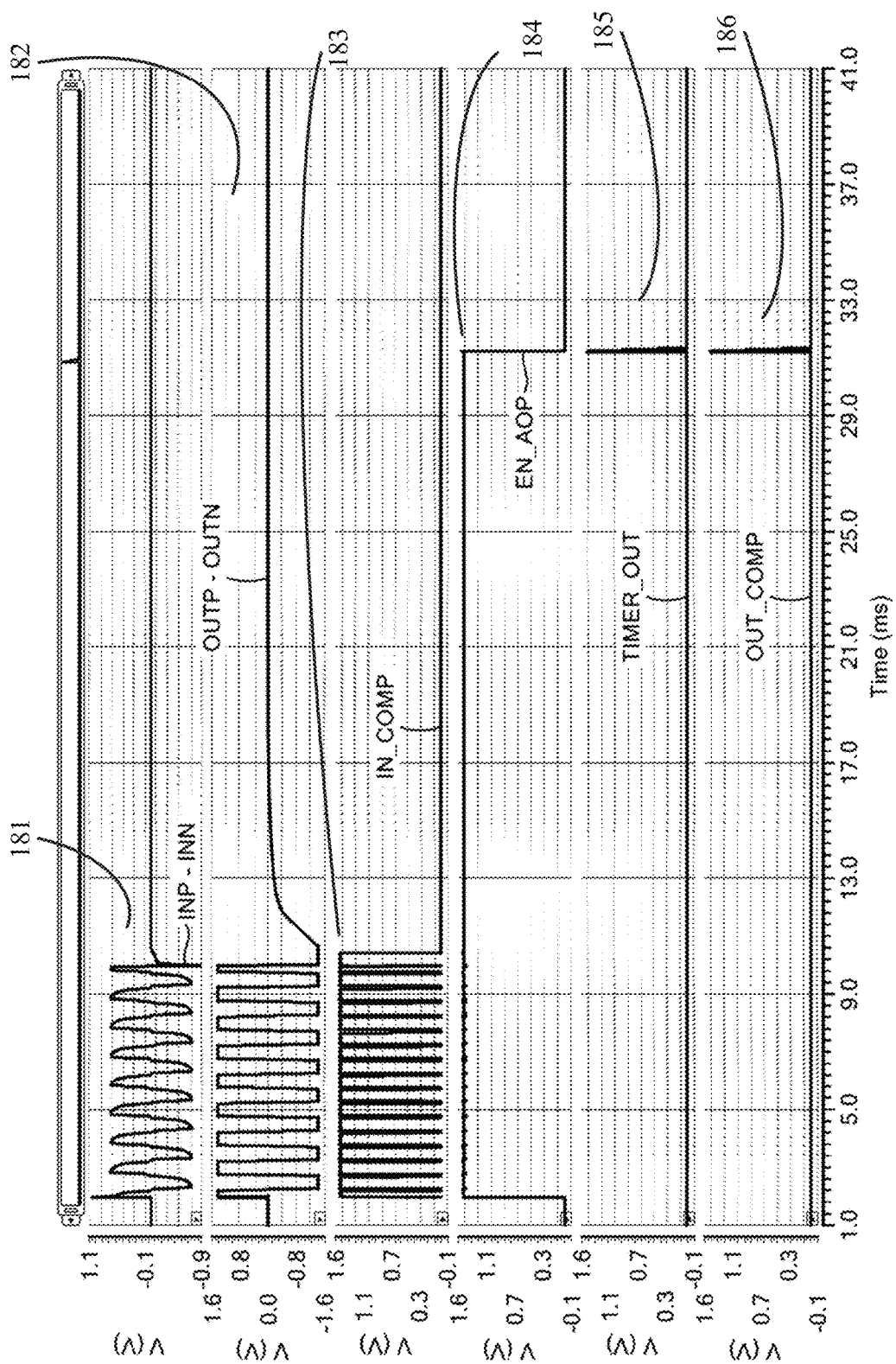
FIG. 1C graphically shows waveforms showing AOP recovery functionality in illustrative embodiments.

FIG. 1B graphically shows response to AOP event with no recovery circuitry in various embodiments, and FIG. 1C graphically shows waveforms showing AOP recovery functionality in illustrative embodiments.

FIG. 1C shows a typical case for an AOP recovery event. This illustrative embodiment is for the differential charge amplifier architecture (see, e.g., FIG. 2 or FIG. 3) so INP 112 and INN 113 appear as virtual grounds unless and until the amplifier 220 rails out.

In this case, the very high signal AOP event starts at 2 ms, as schematically illustrated by curve 181 in FIG. 1C, which represent a differential signal between transducer output terminals 112 and 113 (i.e., INP-INN).

As can be seen, the output differential (OUTP-OUTN) 182 rails out which causes the input differential (INP-INN) 181 to stop being virtual grounds and start moving.

After the differential signal between transducer output terminals 112 and 113 (i.e., INP-INN) is higher than the positive threshold voltage or lower than the negative threshold voltage of the input window comparator 320, the window comparator output signal 183 output goes high. This sets the SR-Latch 420, which enables the One-Shot Timer 430 (signal 184), and consequently causes the drain switches 233, 238 to go into a closed configuration, which reduces the impedance between the voltage source (Vcm) and the output terminals 111, 112 of the transducer 110.

Every time the input comparator 320 (IN_COMP) goes high again, the timer 430 is reset. Once the AOP event terminates (or "goes away") (and in illustrative embodiments, the offset charge is removed from the inputs of the input comparator 320), the output of the input comparator 320 goes low and stays low, and the One-Shot Timer 430 eventually times out. In illustrative embodiments, the timer 430 is set to time out after a pre-determined time, which may be referred-to as the timer's "countdown" time, or "delay" time. The timer's countdown time, in some embodiments, is 10 milliseconds, and in other embodiments is 20 ms, 30 ms, 40 ms, or 50 ms, to name but a few examples.

Once this happens the TIMER_OUT signal 185 signal goes high, which enables the output window comparator 440. Since OUTP-OUTN (i.e., the differential output of the amplifier 220) in this case is already within the window of the window comparator 440, the output comparator 440 asserts signal 186 (OUT_COMP) which disables the One-Shot Timer 430, disables the Output Comparator 440, and disables (i.e., opens) drain switches 233 and 238, which increases the bias resistors back to their normal (e.g., 1 T Ω) value state.

FIG. 1B shows what would happen after an AOP event with no recovery circuitry 300, 400. As shown, the event happens as in FIG. 1C, but when it goes away, a differential offset is trapped on the inputs (INP-INN) 181, which causes the differential output (OUTP-OUTN) 182 to rail out and stay stuck in this railed out state for a few seconds, rendering the device 110 unfunctional during this time.

Figure 2:
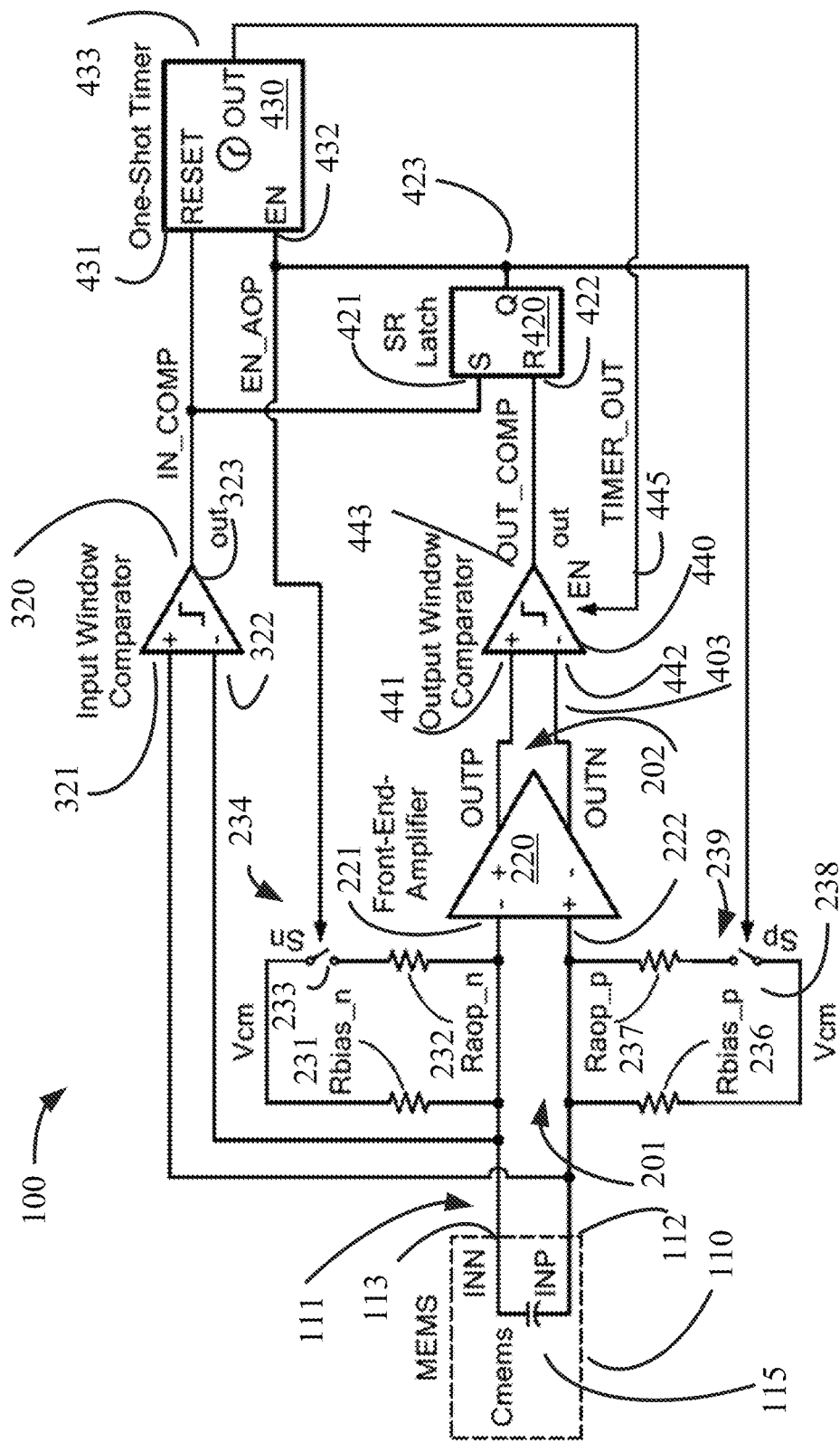
FIG. 2 schematically illustrates an embodiment of a transducer system with remedial circuit.

FIG. 2 schematically illustrates an embodiment of a transducer system with remedial circuits 300, 400.

FIG. 2 shows a block diagram of the AOP recovery circuit 100. It includes a transducer signal comparator 320, an output comparator 440, a latch 420, a timer 430 (which, in some embodiments, is a one-shot timer), a first drain switch (Sn) 233, and a second drain switch (Sp) 238. Some embodiments include a first drain resistor (Raop_n) 232 coupled in series with the first drain switch 233, and a second drain resistor (Raop_p) 237 coupled in series with the second drain switch 238. The rest of the circuitry shown makes up the normal Front-End amplifier 220 and sensor interface that the AOP recovery circuit 100 is supporting.

When an AOP event takes place, the transducer 110 (e.g., which may be a MEMS sensor) can produce very large voltage signals. This can trap a differential offset charge on the nodes INP 112 and INN 113 due to non-linearities present, arising from non-linear circuit elements such as ESD diodes or transistors attached to those nodes. This large offset will be gained up by the Front-End-Amplifier 220 and can easily rail it out, causing the sensitivity to be wrong/zero until the charge offset can be removed from INP 112 & INN 113.

With no additional AOP recovery circuitry (i.e., without 300 and 400, and the switches and other circuits under their control), the time constants involved in removing the offset charge from INP 112 & INN 113 can be on the order of multiple seconds. This is due to the fact that Rbias_p 236 & Rbias_n 231 are on the order of 1 T Ω while the capacitance (e.g., MEMS capacitance) holding the charge= is typically on the order of single-digit picofarads ("pF's) (tau=R*C=1T Ω*1 pF=1 s). Consequently, the capacitor circuits undesirably have a long time constant, which means it could take multiple seconds for the system 100 to become functional after an AOP event.

To avoid that undesirable situation, the system 100 first senses when an acoustic overload event takes place. This is accomplished with the input comparator 320 attached to INP 112 and/or INN 113. By appropriately setting the positive and/or negative thresholds (to define the window) large enough to not cause issues with normal operation but small enough to sense an AOP event when it happens, the system 100 can engage the rest of the circuit to quickly recover back to normal operation.

Second, when the input comparator 320 signals that it has detected an AOP event (i.e., in illustrative embodiments, it asserts a logic "1"), it sets a Set-Reset Latch 420 (SR-Latch). Setting the SR-Latch does two things.

First, it enables (i.e., closes into a closed configuration) drain switches 238 (Sp) and 233 (Sn). This controllably couples drain resistors 237 (Raop_p) and 232 (Raop_n) in parallel with, respectively, bias resistor 235 (Rbias_p) and bias resistor 231 (Rbias_n) respectively which, in illustrative embodiments, reduces the total bias resistance by a factor of more than 1000 times.

Second, it enables the One-Shot Timer 430 used to guarantee that the drain switches 23, 238 are enabled (i.e., kept in closed configuration) long enough to remove all of the trapped offset charge. In illustrative embodiments, this duration is a function of the values of transducer capacitance (Cmems) 115, resistor (Raop_p) 237, and resistor (Raop_n) 232, and should be on the order of tens of milliseconds. For example, the timer's countdown time should be, in illustrative embodiments, 10 ms, and in other embodiments 20 ms, 30 ms, 40 ms, or 50 ms, to name but a few examples. After being enabled, this one-shot timer 430 is reset every time the input window comparator 320 trips, which signifies that the AOP event is still taking place.

After the AOP event is gone and the input window comparator 320 stops resetting the timer 430, the timer 430 will, after the passage of a pre-determined time span (its countdown time), time out and enable the output window comparator 440.

The output window comparator 440 is used to re-configure the AOP circuitry back to pre-event states. This is accomplished by disabling the One-Shot Timer 430 and the Output Window Comparator 440, and opening drain switches 238 (Sp) and 233 (Sn).

Instead of a window comparator, some embodiments use a zero-crossing comparator for the output comparator 440. However, preferred embodiments use a window comparator as the output comparator 440 to determine when to release the AOP circuitry in order to make sure it is done when the output of amplifier 220 is near zero. This keeps unwanted signal-charge from being trapped on the MEMS inputs. In some embodiments, the output comparator is a window comparator (e.g., as opposed to a zero-crossing comparator) to facilitate the release even with no signal and whatever DC amplifier offset is present. This window needs to be set above the maximum value of DC offset expected at the output of the amplifier 220.

In FIG. 2, the transducer 110 produces a differential transducer output signal on terminal 112 and terminal 113 of its output interface 111. Terminal 112 and terminal 113 are in electrical communication, respectively, with the non-inverting input terminal 222 of amplifier 220 and the inverting input terminal 221 of amplifier 220. The amplifier 220 produces a differential output at its output interface 202, which output signal is the system output. When the system 100 is not suffering an AOP event, then the signal chain 201 is, in some embodiments, linear in operation.

The non-inverting input terminal 222 of amplifier 220 is biased from bias voltage source (Vcm) via a first bias resistor 231, and the inverting input terminal 221 of amplifier 220 is biased from bias volage source (Vcm) via a second bias resistor 236. In normal operation (e.g., when the system is not experiencing an AOP event) switches 233 and 238 are in an open configuration, and so those switches and resistor 232 and 237 are not in electrical parallel with drain resistors 231 and 236, respectively.

The differential transducer output signal on terminal 112 and terminal 113 of its output interface 111 is also provided to the input interface of input comparator 320, including non-inverting input terminal 321 and inverting input terminal 322. In illustrative embodiments, the input comparator 320 is a window comparator, but in other embodiments, comparator 320 is a single-ended comparator configured to compare the electrical signal on transducer output 113 to a reference voltage.

When the comparator 320 detects an AOP event, the comparator 320 asserts an AOP event signal 183 at comparator output terminal 323. The comparator output terminal 323 is in electrical communication with a "set" terminal 421 of SR latch 420, and a reset terminal 431 of time 430.

When the comparator 320 asserts its AOP event signal 183 at comparator output terminal 323, the SR latch sets, causing the SR latch to produce a logic "1" signal at its Q output terminal 423. The Q output terminal 423 is electrically coupled to the first drain switch 233 and the second drain switch 238, and the logic "1" signal at its Q output terminal 423 causes each of those drain switches to be in its closed configuration. That, in turn, causes the drain switches 233 and 238, and drain resistors 232 and 237, to be switched into electrical parallel with the bias resistors 231 and 236, thereby causing any charge in the transducer 110, and other capacitances coupled to the transducer output terminal 112 and 113, to drain more quickly than in a configuration in which the drain switches 233 and 238 were in their open state.

The Q output terminal 423 is also in electrical communication with the enable terminal 432 of the timer 430, and so a logic "1" signal at the Q output terminal 423 will cause timer 430 to begin its countdown, but not until the comparator 320 stops asserting the AOP event signal.

When the timer's countdown has elapsed (i.e., the timer 430 has "timed out"), the timer 430 produces a timer output signal 185 on its timer output terminal 433. The timer output terminal 433 is in electrical communication with an enable terminal 445 on output comparator 440. In response to receipt of the timer output signal at enable terminal 445 on output comparator 440, and because the amplifier output signal is within window of the output comparator 440 (since the AOP event has terminated), the comparator 440 produces a latch reset signal ("Out_Comp") on its output terminal 443, which output terminal 443 is in electrical communication with the reset terminal 442 of the latch 420. That causes the latch 420 to reset, and the latch 420 consequently changes the signal at terminal 423 to a logic "0". That, in turn, causes the first drain switch 233 and the second switch 238 to change to an open configuration, thereby electrically removing those switches (and their associate drain resistors) to no longer be in parallel with the bias resistors 231 and 238, thereby returning the signal path 201 to normal operation.

Figure 3:
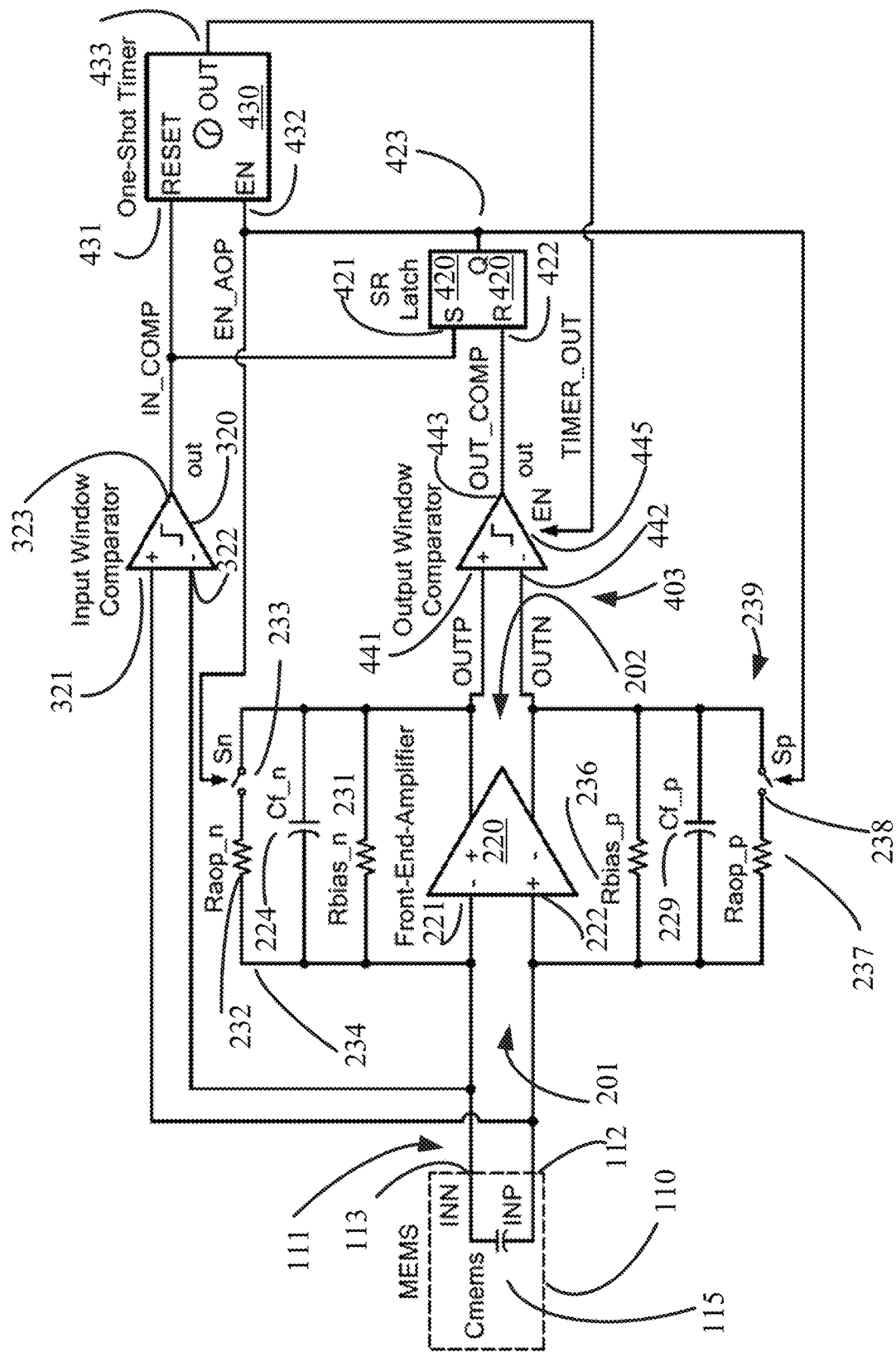
FIG. 3 schematically illustrates an embodiment of a transducer system with remedial circuit.

FIG. 3 schematically illustrates an embodiment of a transducer system with remedial circuit.

One embodiment interfaces the AOP recovery with a charge style amplifier that uses capacitive feedback around the front-end amplifier 220. To that end, a first feedback capacitor 224 is coupled in feedback between the non-inverting output of amplifier 220 and the inverting input terminal of amplifier 220, and a second feedback capacitor 239 coupled in feedback between the inverting output terminal of amplifier 220 and the non-inverting input terminal of amplifier 220.

In FIG. 3, first drain switch 233 is in electrical series with first drain resistor 232, coupled in feedback between the non-inverting output of amplifier 220 and the inverting input terminal of amplifier 220. When the first drain switch 233 is in a closed configuration, the first drain switch 233 and the first drain resistor 232 present a discharge path in parallel with the first feedback capacitor 224, thereby allowing charge on the first feedback capacitor 224 to drain from one end of the first drain capacitor 224 to the other end of the first drain capacitor 224. When the first drain switch 233 is in an open configuration, the first drain switch 233 and first drain resistor 232 do not present such a discharge path.

Second drain switch 238 is in electrical series with second drain resistor 237, coupled in feedback between the inverting output terminal of amplifier 220 and the non-inverting input terminal of amplifier 220. When the first drain switch 238 is in a closed configuration, the second drain switch 238 and second drain resistor 237 present a second discharge path in parallel with the second feedback capacitor 229, thereby allowing charge on the second feedback capacitor 229 to drain from one end of the second feedback capacitor 229 to the other end of the second feedback capacitor 229. When the second drain switch 238 is in an open configuration, the second drain switch 238 and second drain resistor 237 do not present such a discharge path.

In this embodiment, the comparator 320, the latch 420, the timer 430, and the comparator 440 operate as described above to close, and then open, drain switches 233 and 238.

In this embodiment, however, the thresholds of the Input Window Comparator 320 can be set lower due to the virtual grounds that appear at INP 112 terminal and the INN 113 terminal at the output of transducer 110. Under this architecture, INP 112 and INN 113 will not move unless the amplifier 220 rails out from an AOP event so the threshold can be set to a value just higher than the expected offsets of the amplifier 220.

Figure 4:
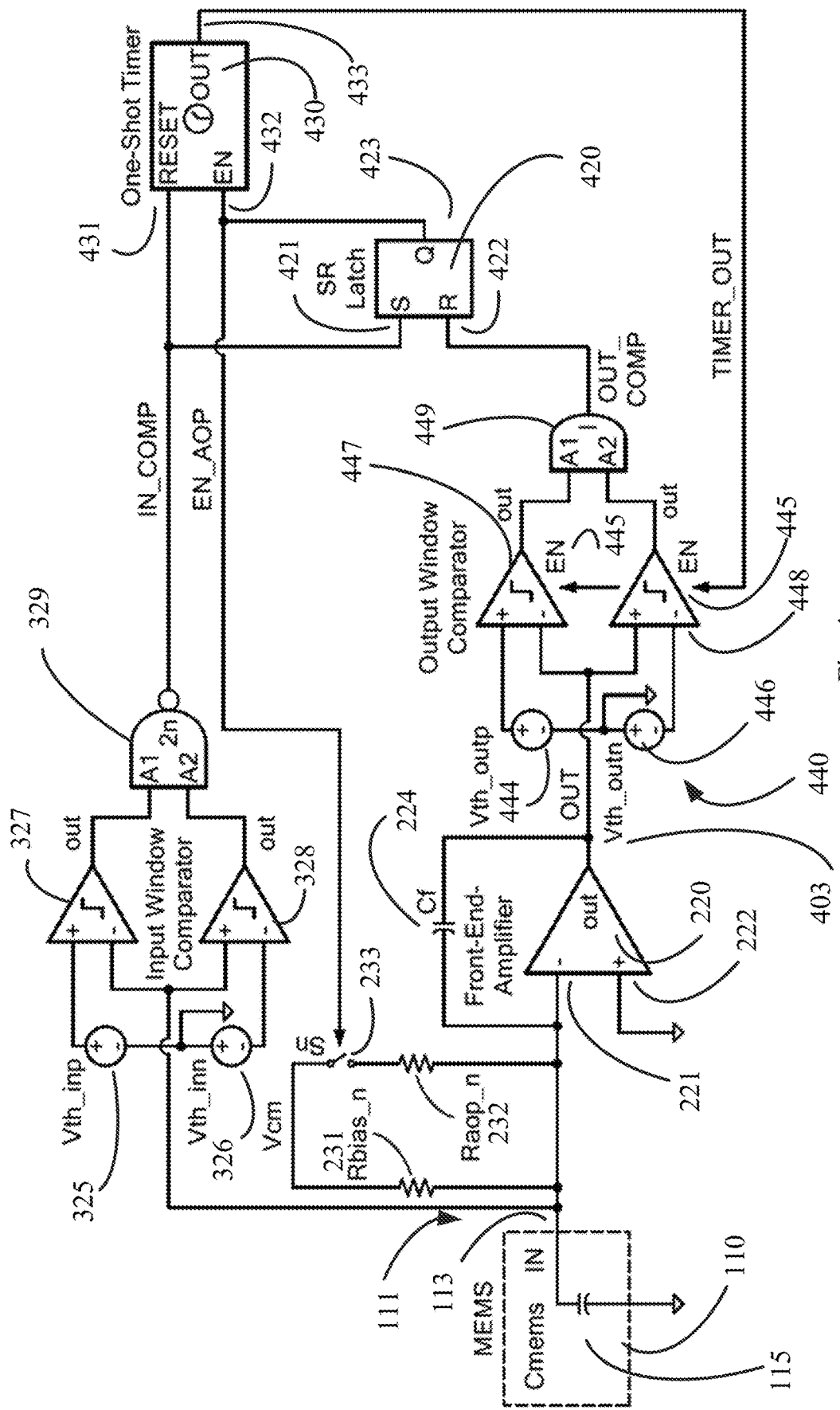
FIG. 4 schematically illustrates an embodiment of a transducer system with remedial circuit.

FIG. 4 schematically illustrates an embodiment of a transducer system with a single-ended charge amplifier 220.

Another variation uses this with a single-ended output front-end-amplifier 220 configured as a charge amplifier. This can be used for both the voltage or charge style architectures. The difference under these configurations is to replace the non-inverting (or "negative") input of the output window comparator 440 with a common-mode reference voltage instead of the negative output of the front-end-amplifier 220.

FIG. 4 shows more details on the implementation of the input window comparator 320 and output window comparator 440, and how they function. This configuration is a single-ended input and single-ended output charge stye amplifier 220.

The input comparator 320 has two comparators 327, 328 and two thresholds, one positive (Vth_inp) and one negative (Vth_inn), provided by voltage sources 325 and 326, respectively.

The output ("IN_COMP") of the input comparator 320 is high if the transducer output signal outside of (i.e., not within) the input window of the input comparator 320. If everything is working properly, then the signal output ("IN") from the transducer 110 should be at GND potential and the outputs of the two comparators 327, 328 will be high. Combining these together with a NAND gate 329 will cause the node IN_COMP to be low. A large enough AOP event will cause the virtual GND node at the output terminal 113 of the transducer 110 to lose control and move above or below GND potential.

If IN rises above Vth_inp or below Vth_inn, one of the two comparator outputs will go low and IN_COMP 183 will go high, setting the SR-Latch 420 and initiating operation of the recovery circuitry.

The output comparator 440 is very similar to the input comparator 320 except that the output ("Out_Comp") is high if the signal from the amplifier 220 is within the output window of the output comparator 440.

The output comparator 440 has two comparators 447, 448 and two thresholds, one positive (Vth_outp) and one negative (Vth_outn), provided by voltage sources 444 and 446, respectively. The outputs of the two comparators 447, 448 are combined with a AND gate 449. The combined output-comparator output OUT_COMP will be low if OUT is above Vth_outp or below Vth_outn and will go high when it is below Vth_outp and above Vth_outn (within the window). When the output goes high it resets the SR-Latch 420 and shuts down the AOP recovery circuitry.

In some examples, this recovery circuit may recover back to full functionality in less than 50 ms from commencement of an AOP event.

Figure 5:
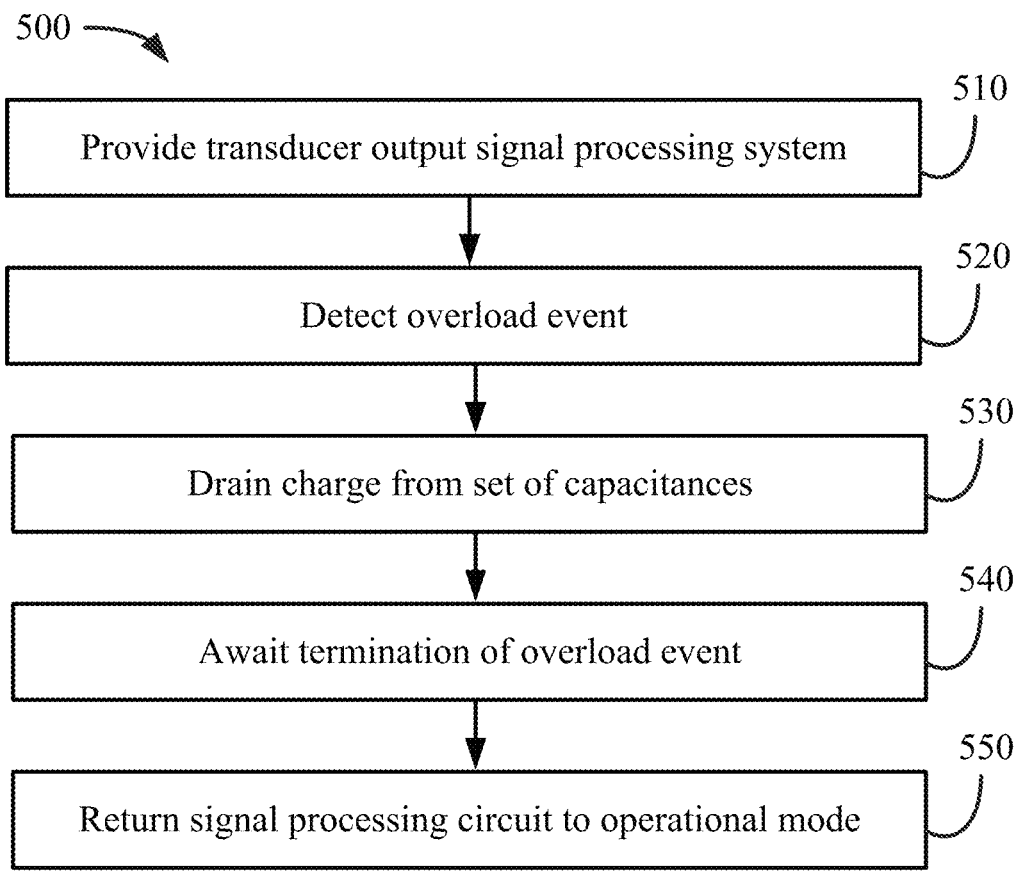
FIG. 5 is a flow chart of a method of operating a transducer signal processing system.

FIG. 5 is a flow chart of a method 500 of operating a transducer signal processing system.

Step 510 includes providing a transducer output signal processing system 100. For example, such a system may include any of the systems of FIG. 2, FIG. 3, or FIG. 4.

Step 520 includes detecting an AOP overload event. Such an event may be detected, for example, by any of the input comparators 320 of FIG. 2, FIG. 3, or FIG. 4.

Step 530 includes, in response to detecting an AOP overload event, draining charge from one or more capacitances in the signal processing circuit 200 or in the transducer 110. Such charge may be drained, for example, by operating drain switches as described in connection with FIG. 2, FIG. 3, or FIG. 4.

Step 540 includes awaiting termination of the AOP overload event. This is performed by the timer 430 as described in connection with FIG. 2, FIG. 3, or FIG. 4.

Step 550 includes returning the signal processor circuit 200 to linear operation. This may be accomplished by operating drain switches into their respective open configurations, as described in connection with FIG. 2, FIG. 3, or FIG. 4.

A listing of certain reference numbers is presented below.
- 100: System;
- 105: System output terminal;
- 110: Transducer;
- 111: Transducer output interface;
- 112: Transducer positive output terminal;
- 113: Transducer negative output terminal;
- 115: Transducer capacitance;
- 120: Signal chain;
- 200: Signal processor circuit;
- 201: Signal processor input;
- 202: Signal processor output;
- 220: Front-End Amplifier;
- 221: Front-End Amplifier inverting input;
- 222: Front-End Amplifier non-inverting input;
- 224: First feedback capacitor;
- 229: Second feedback capacitor;
- 231: First biasing resistor;
- 232: First drain resistor;
- 233: First drain switch;
- 234: First drain path;
- 236: Second biasing resistor;
- 237: Second drain resistor;
- 238: Second drain switch;
- 239: Second drain path;
- 300: Acoustic overload detector;
- 301: Detector input interface;
- 302: Detector output terminal;
- 320: Transducer signal comparator;
- 321: Transducer signal comparator non-inverting input terminal;
- 322: Transducer signal comparator inverting input terminal;
- 323: Transducer signal comparator output terminal;
- 325: First input window comparator reference;
- 326: Second input window comparator reference;
- 327: First input window comparator;
- 328: Second input window comparator;
- 329: NAND gate;
- 400: Reset circuit terminal;
- 401: Reset circuit input terminal;
- 402: Reset circuit output terminal;
- 403: Reset circuit feedback terminal;
- 420: AOP event latch;
- 421: Latch SET input terminal;
- 422: Latch RESET input terminal;
- 423: Latch output terminal;
- 430: Timer;
- 431: Timer RESET input terminal;
- 432: Timer ENABLE input terminal;
- 433: Timer output terminal;
- 440: Output comparator;
- 441: Output comparator noninverting input terminal;
- 442: Output comparator inverting input terminal;
- 443: Output comparator output terminal;
- 445: Output comparator ENABLE input terminal;
- 444: First output comparator reference;
- 446: Second output comparator reference;
- 447: First output comparator;
- 448: Second output comparator;
- 449: AND gate.

Various embodiments may be characterized by the potential claims listed in the paragraphs following this paragraph (and before the actual claims provided at the end of this application). These potential claims form a part of the written description of this application. Accordingly, subject matter of the following potential claims may be presented as actual claims in later proceedings involving this application or any application claiming priority based on this application. Inclusion of such potential claims should not be construed to mean that the actual claims do not cover the subject matter of the potential claims. Thus, a decision to not present these potential claims in later proceedings should not be construed as a donation of the subject matter to the public.

Without limitation, potential subject matter that may be claimed (prefaced with the letter "P" so as to avoid confusion with the actual claims presented below) includes:

P1. A transducer signal processing apparatus comprising:
a signal processing circuit having an input interface configured to receive a transducer output signal from a transducer output interface, and an output interface configured to produce a system output signal produced from the transducer output signal;
an overload sensor circuit having an overload sensor input interface to receive the transducer output signal, and configured to detect an acoustic overload event, and an overload sensor output interface configured to provide an acoustic overload signal in response to detection of an acoustic overload; and a system reset circuit configured to reset the signal processing circuit in response to detection of an acoustic overload event, the system reset circuit having an input interface coupled to the overload sensor output interface, and an output interface configured to produce control signals to control circuit to drain charge from capacitances coupled to the apparatus.

P2. The transducer signal processing apparatus of P1, wherein the overload sensor circuit is configured to detect an acoustic overload event by detecting that the transducer output signal indicates an acoustic overload.

P3. The transducer signal processing apparatus of any of P1-P2, wherein the overload sensor circuit is configured to detect an acoustic overload event by detecting that the transducer output signal exceeds a pre-determined acoustic overload threshold amplitude.

P4. The transducer signal processing apparatus of any of P1-P3, wherein the overload sensor circuit is configured to detect an acoustic overload event by detecting that the transducer output signal is clipped.

P5. The transducer signal processing apparatus of P3, wherein the signal processing circuit has a signal chain acoustic overload point, and wherein the acoustic overload threshold is predetermined to be at or below the signal chain acoustic overload point, and to be lower than an acoustic overload point of the transducer.

P6. The transducer signal processing apparatus of P3, wherein the transducer has a transducer acoustic overload point, and the acoustic overload threshold is predetermined to be at or below the transducer acoustic overload point.

P7. The transducer signal processing apparatus of any of P1-P6, wherein the transducer has a transducer acoustic overload point amplitude, and the overload sensor circuit is configured to detect an acoustic overload event by determining that an amplitude of the transducer output signal exceeds the transducer acoustic overload point amplitude.

P8. The transducer signal processing apparatus of any of P1-P7, wherein the signal processing circuit comprises:

a charge amplifier having a set of capacitors, each capacitor of the set of capacitors disposed to charge in response to receipt, by the signal processing circuit, of the transducer output signal;

a set of switches, each switch having an open configuration and a closed configuration, each switch of the set of switches in electrical parallel to a corresponding capacitor from the set of capacitors, and coupled to allow said corresponding capacitor to discharge when said switch is in a closed configuration; and each switch of the set of switches coupled to the system reset circuit and controllable by the system reset circuit into its closed configuration.

P9. The transducer signal processing apparatus of P8, wherein the system reset circuit includes a timer in control communication with the acoustic overload detector and configured to control each switch of the set of switches into its respective closed configuration for a pre-determined period of time in response to receipt, at the system reset circuit from the overload sensor circuit, of an acoustic overload signal.

P10. The transducer signal processing apparatus of any of P1-P9, wherein the signal processing circuit comprises:

an amplifier having an amplifier input interface operably coupled to receive the transducer output signal:

a set of bias resistors, each bias resistor of the set of bias resistors electrically coupled between the amplifier input interface and a bias voltage source;

for each bias resistor, a drain path comprising:

a drain resistor, the drain resistor having an electrical resistance less than a corresponding bias resistor, and a drain switch in electrical series with the drain resistor, the drain switch controllably configurable between an open configuration and a closed configuration, the drain switch in control communication with the system reset circuit to receive a control signal from the system reset circuit to controllably configure the drain switch into one of the open configuration, and in response to an overload event into the closed configuration, the drain path electrically coupled between the signal processing circuit input interface and the bias voltage source; such that:

when the drain switch is in its closed configuration, the drain path presents a low-impedance discharge path, in electrical parallel to its corresponding bias resistor, between the transducer and bias voltage source, and when the drain switch is in its open configuration, the drain path presents a high impedance path between the transducer and bias voltage source, said high impedance path having an impedance higher than the impedance of the low-impedance discharge path.

P11. The transducer signal processing apparatus of any of P1-P10, wherein the transducer output signal is a differential signal produced from a first transducer output terminal and a second transducer output terminal, the first transducer output terminal and the second transducer output terminal comprising the transducer output interface, and wherein the signal processing circuit comprises:

an amplifier having a differential amplifier input interface operably coupled to receive the differential transducer output signal;

a first bias resistor electrically coupled between a first amplifier input terminal and a bias voltage source;

a first drain path comprising:

a first drain resistor, the first drain resistor having an electrical resistance less than the first bias resistor, and a first drain switch in electrical series with the first drain resistor, the first drain switch controllably configurable between an open configuration and a closed configuration, the first drain switch in control communication with the system reset circuit to receive a control signal from the system reset circuit to controllably configure the first drain switch into one of the open configuration, and in response to an overload event into the closed configuration, such that:

when the first drain switch is in its closed configuration, the first drain path presents a low-impedance first discharge path, in electrical parallel to the first bias resistor, between a first transducer output terminal and the bias voltage source, said first discharge path having a resistance less than the resistance of the first bias resistor, and when the first drain switch is in its open configuration, the first drain path presents a high impedance path between the first transducer output terminal and bias voltage source, said high impedance path having an impedance higher than the impedance of the low-impedance discharge path and higher than the resistance of the first bias resistor;

a second bias resistor electrically coupled between a second amplifier input terminal and the bias voltage source;

a second drain path comprising:
a second drain resistor, the second drain resistor having an electrical resistance less than the second bias resistor, and
a second drain switch in electrical series with the second drain resistor, the second drain switch controllably configurable between an open configuration and a closed configuration, the second drain switch in control communication with the system reset circuit to receive a control signal from the system reset circuit to controllably configure the second drain switch into one of the open configuration, and in response to an overload event into the closed configuration, such that:
when the second drain switch is in its closed configuration, the second drain path presents a low-impedance second discharge path, in electrical parallel to the second bias resistor, between a second transducer output terminal and the bias voltage source, said second discharge path having a resistance less than the resistance of the second bias resistor, and
when the second drain switch is in its open configuration, the second drain path presents a high impedance path between the second transducer output terminal and bias voltage source, said high impedance path having an impedance higher than the impedance of the low-impedance discharge path and higher than the resistance of the second bias resistor.

P12. The transducer signal processing apparatus of any of P1-P11, wherein the transducer output signal is a differential signal produced from a first transducer output terminal and a second transducer output terminal, the first transducer output terminal and the second transducer output terminal comprising the transducer output interface, and wherein the signal processing circuit comprises:
a charge amplifier having a differential amplifier input interface comprising an inverting input and a non-inverting input, differential amplifier input interface operably coupled to receive the differential transducer output signal, the charge amplifier having:
a first feedback capacitor coupled to the inverting input; and
a second feedback capacitor coupled to the non-inverting input;
a first drain path coupled in electrical parallel with the first feedback capacitor, the first drain path including a first drain switch controllably configurable between an open configuration and a closed configuration, the first drain switch in control communication with the system reset circuit to receive a control signal from the system reset circuit to controllably configure the first drain switch into one of the open configuration, and in response to an overload event into the closed configuration, such that:
when the first drain switch is in its closed configuration, the first drain path presents a low-impedance first discharge path, in electrical parallel to the first feedback capacitor, said first discharge path having a resistance less than the resistance of the first bias resistor; and
a second drain path coupled in electrical parallel with the second feedback capacitor, the second drain path including a second drain switch controllably configurable between an open configuration and a closed configuration, the second drain switch in control communication with the system reset circuit to receive the control signal from the system reset circuit to controllably configure the second drain switch into one of the open configuration, and in response to an overload event into the closed configuration, such that:
when the second drain switch is in its closed configuration, the second drain path presents a low-impedance second discharge path, in electrical parallel to the second feedback capacitor, said second discharge path having a resistance less than the resistance of the second bias resistor.

P13. 13. A method of operating a transducer system having a signal path, the comprising:
detecting an acoustic overload event;
in response to detecting an acoustic overload event, engaging a set of drain paths, each drain path controllably providing a low resistance electrical path to drain charge from a corresponding capacitor in the signal path; and
detecting termination of acoustic overload event, and
in response to detecting the termination of the acoustic overload event, starting a timer having a pre-determined delay time, the timer asserting a termination signal after passage of the pre-determined delay time, and
in response to the termination signal, disengaging the set of drain paths to return the signal path to linear operation.

P14: The method of P13, wherein detecting an acoustic overload event comprises determining that an amplitude of a transducer output signal exceeds a pre-determined threshold.

P15. The method of any of P13-P14, wherein engaging a set of drain paths comprises, for each drain path, operating a switch into a closed configuration, the switch in parallel to a corresponding capacitance to allow charge to drain from the corresponding capacitance.

P16. The method of P15, wherein disengaging the set of drain paths comprises, for each drain path, operating a switch into an open configuration to prevent charge from draining from the corresponding capacitance.

P17. A transducer signal processing apparatus comprising: means for processing a transducer output signal from a transducer output interface; means for sensing, from the transducer output signal, an acoustic overload event from the transducer; and means for resetting the means for processing the transducer output signal in response to detection of an acoustic overload event.

P18. The transducer signal processing apparatus of P17, wherein the means for sensing an acoustic overload event comprises a comparator having a comparator threshold indicating occurrence of an acoustic overload event, said comparator producing an AOP signal in response to the transducer output signal exceeding the comparator threshold.

P19. The transducer signal processing apparatus of any of P17-P18, wherein:
the means for processing a transducer output signal comprises a set of capacitances; and wherein
means for resetting the means for processing the transducer output signal in response to detection of an acoustic overload event comprises a set of drain paths, each drain path controllably switchable in electrical parallel with a corresponding capacitance from the set of capacitances, said drain path draining charge from corresponding capacitance in electrical parallel with said corresponding capacitance.

P20. The transducer signal processing apparatus of P19, further comprising a timer to controllably switch the set of drain paths into electrical parallel with a corresponding capacitance from the set of capacitances for a pre-determined length of time, and thereafter to controllably open set of drain paths to remove each said drain path from being electrical parallel with its corresponding capacitance.

P51. A transducer system comprising:
 a transducer having an output port;
 an AOP overload sensor electrically coupled to the transducer's output port, the AOP overload sensor configured to produce an overload signal in response to detecting an AOP event; and
 a remedial circuit configured to reset the transducer system in response to receipt at the remedial circuit of the overload signal.

P52. The transducer system of P51, wherein the overload sensor comprises a comparator configured to produce the overload signal in response to output of the transducer exceeding a pre-defined threshold.

P53. The transducer system of P51, wherein the overload sensor comprises an analog-to-digital converter configured to convert output of the transducer to a digital signal, and to produce the overload signal in response to output of the transducer exceeding a pre-defined threshold.

P54. The transducer system of P51, wherein the overload sensor comprises a microcontroller.

P55. The transducer system of any of P51-P54, wherein the remedial circuit comprises:
 a latch circuit electrically coupled to receive the overload signal and to produce a latch output signal in response to receipt of the overload signal;
 a one-shot timer electrically coupled to receive the overload signal, the one-shot timer configured
  (i) to reset in response to receipt of the overload signal, and
  (ii) to produce a timer output signal after a pre-determined delay period measured from receipt of a most recent overload signal, the delay period exceeding exceeds the period of the lowest frequency of the transducer output signal;
 a set of capacitors, each capacitor of the set of capacitors electrically coupled to a respective amplifier circuit; and
 a set of resistors, each resistor of the set of resistors coupled to a corresponding switch, the resistor disposed to be controllably coupled in parallel with a respective capacitor from the set of capacitors; each corresponding switch in electrical communication with the latch output signal and configured to couple the resistor in parallel to its respective capacitor in response to receipt of the latch output signal.

Various embodiments of this disclosure may be implemented at least in part in any conventional computer programming language. For example, some embodiments may be implemented in a procedural programming language (e.g., "C"), or in an object-oriented programming language (e.g., "C++"), or in Python, R, Java, LISP or Prolog. Other embodiments of this disclosure may be implemented as preprogrammed hardware elements (e.g., application specific integrated circuits, FPGAs, and digital signal processors), or other related components.

In an alternative embodiment, the disclosed apparatus and methods may be implemented as a computer program product for use with a computer system. Such implementation may include a series of computer instructions fixed either on a tangible medium, such as a non-transitory computer readable medium (e.g., a diskette, CD-ROM, ROM, FLASH memory, or fixed disk). The series of computer instructions can embody all or part of the functionality previously described herein with respect to the system.

Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies.

Among other ways, such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of this disclosure may be implemented as a combination of both software (e.g., a computer program product) and hardware. Still other embodiments of this disclosure are implemented as entirely hardware, or entirely software.

Computer program logic implementing all or part of the functionality previously described herein may be executed at different times on a single processor (e.g., concurrently) or may be executed at the same or different times on multiple processors and may run under a single operating system process/thread or under different operating system processes/threads. Thus, the term "computer process" refers generally to the execution of a set of computer program instructions regardless of whether different computer processes are executed on the same or different processors and regardless of whether different computer processes run under the same operating system process/thread or different operating system processes/threads.

The embodiments described above are intended to be merely exemplary; numerous variations and modifications will be apparent to those skilled in the art. All such variations and modifications are intended to be within the scope of the present disclosure as defined in any appended claims.

What is claimed is:

1. A transducer signal processing apparatus comprising:
 a signal processing circuit having an input interface configured to receive a transducer output signal from a transducer output interface, and an output interface configured to produce a system output signal produced from the transducer output signal;
 an overload sensor circuit having an overload sensor input interface to receive the transducer output signal, and configured to detect an acoustic overload event, and an overload sensor output interface configured to provide an acoustic overload signal in response to detection of an acoustic overload, wherein the overload sensor circuit is configured to detect an acoustic overload event by detecting that the transducer output signal indicates an acoustic overload; and
 a system reset circuit configured to reset the signal processing circuit in response to detection of an acoustic overload event, the system reset circuit having an input interface coupled to the overload sensor output interface, and an output interface, coupled to the input interface of the system reset circuit, configured to produce control signals to control circuit to drain charge from capacitances coupled to the apparatus.

2. The transducer signal processing apparatus of claim 1, wherein the overload sensor circuit is configured to detect an acoustic overload event by detecting that the transducer output signal exceeds a pre-determined acoustic overload threshold amplitude.

3. The transducer signal processing apparatus of claim 2, wherein the signal processing circuit has a signal chain acoustic overload point, and wherein the acoustic overload threshold is predetermined to be at or below the signal chain acoustic overload point, and to be lower than an acoustic overload point of the transducer.

4. The transducer signal processing apparatus of claim 2, wherein the transducer has a transducer acoustic overload point, and the acoustic overload threshold is predetermined to be at or below the transducer acoustic overload point.

5. The transducer signal processing apparatus of claim 1, wherein the overload sensor circuit is configured to detect an acoustic overload event by detecting that the transducer output signal is clipped.

6. The transducer signal processing apparatus of claim 1, wherein the transducer has a transducer acoustic overload point amplitude, and the overload sensor circuit is configured to detect an acoustic overload event by determining that an amplitude of the transducer output signal exceeds the transducer acoustic overload point amplitude.

7. The transducer signal processing apparatus of claim 1, wherein the signal processing circuit comprises:
  a charge amplifier having a set of capacitors, each capacitor of the set of capacitors disposed to charge in response to receipt, by the signal processing circuit, of the transducer output signal;
  a set of switches, each switch having an open configuration and a closed configuration, each switch of the set of switches in electrical parallel to a corresponding capacitor from the set of capacitors, and coupled to allow said corresponding capacitor to discharge when said switch is in a closed configuration;
  each switch of the set of switches coupled to the system reset circuit and controllable by the system reset circuit into its closed configuration.

8. The transducer signal processing apparatus of claim 7, wherein the system reset circuit includes a timer in control communication with the acoustic overload detector and configured to control each switch of the set of switches into its respective closed configuration for a pre-determined period of time in response to receipt, at the system reset circuit from the overload sensor circuit, of an acoustic overload signal.

9. The transducer signal processing apparatus of claim 1, wherein the signal processing circuit comprises:
  an amplifier having an amplifier input interface operably coupled to receive the transducer output signal:
  a set of bias resistors, each bias resistor of the set of bias resistors electrically coupled between the amplifier input interface and a bias voltage source;
  for each bias resistor, a drain path comprising:
    a drain resistor, the drain resistor having an electrical resistance less than a corresponding bias resistor, and
    a drain switch in electrical series with the drain resistor, the drain switch controllably configurable between an open configuration and a closed configuration, the drain switch in control communication with the system reset circuit to receive a control signal from the system reset circuit to controllably configure the drain switch into one of the open configuration, and in response to an overload event into the closed configuration,
    the drain path electrically coupled between the signal processing circuit input interface and the bias voltage source; such that:
      when the drain switch is in its closed configuration, the drain path presents a low-impedance discharge path, in electrical parallel to its corresponding bias resistor, between the transducer and bias voltage source, and
      when the drain switch is in its open configuration, the drain path presents a high impedance path between the transducer and bias voltage source, said high impedance path having an impedance higher than the impedance of the low-impedance discharge path.

10. The transducer signal processing apparatus of claim 1, wherein the transducer output signal is a differential signal produced from a first transducer output terminal and a second transducer output terminal, the first transducer output terminal and the second transducer output terminal comprising the transducer output interface, and wherein the signal processing circuit comprises:
  an amplifier having a differential amplifier input interface operably coupled to receive the differential transducer output signal;
  a first bias resistor electrically coupled between a first amplifier input terminal and a bias voltage source;
  a first drain path comprising:
    a first drain resistor, the first drain resistor having an electrical resistance less than the first bias resistor, and
    a first drain switch in electrical series with the first drain resistor, the first drain switch controllably configurable between an open configuration and a closed configuration, the first drain switch in control communication with the system reset circuit to receive a control signal from the system reset circuit to controllably configure the first drain switch into one of the open configuration, and in response to an overload event into the closed configuration, such that:
      when the first drain switch is in its closed configuration, the first drain path presents a low-impedance first discharge path, in electrical parallel to the first bias resistor, between a first transducer output terminal and the bias voltage source, said first discharge path having a resistance less than the resistance of the first bias resistor, and
      when the first drain switch is in its open configuration, the first drain path presents a high impedance path between the first transducer output terminal and bias voltage source, said high impedance path having an impedance higher than the impedance of the low-impedance discharge path and higher than the resistance of the first bias resistor;
  a second bias resistor electrically coupled between a second amplifier input terminal and the bias voltage source;
  a second drain path comprising:
    a second drain resistor, the second drain resistor having an electrical resistance less than the second bias resistor, and
    a second drain switch in electrical series with the second drain resistor, the second drain switch controllably configurable between an open configuration and a closed configuration, the second drain switch in control communication with the system reset circuit to receive a control signal from the system reset circuit to controllably configure the second drain switch into one of the open configuration, and in response to an overload event into the closed configuration, such that:
  when the second drain switch is in its closed configuration, the second drain path presents a low-impedance second discharge path, in electrical parallel to the second bias resistor, between a second transducer output terminal and the bias voltage source, said second discharge path having a resistance less than the resistance of the second bias resistor, and
  when the second drain switch is in its open configuration, the second drain path presents a high impedance path between the second transducer output terminal and bias voltage source, said high impedance path having an impedance higher than the impedance of the low-impedance discharge path and higher than the resistance of the second bias resistor.

11. The transducer signal processing apparatus of claim 1, wherein the transducer output signal is a differential signal produced from a first transducer output terminal and a second transducer output terminal, the first transducer output terminal and the second transducer output terminal comprising the transducer output interface, and wherein the signal processing circuit comprises:
  a charge amplifier having a differential amplifier input interface comprising an inverting input and a non-inverting input, differential amplifier input interface operably coupled to receive the differential transducer output signal, the charge amplifier having:
    a first feedback capacitor coupled to the inverting input; and
    a second feedback capacitor coupled to the non-inverting input;
  a first drain path coupled in electrical parallel with the first feedback capacitor, the first drain path including a first drain switch controllably configurable between an open configuration and a closed configuration, the first drain switch in control communication with the system reset circuit to receive a control signal from the system reset circuit to controllably configure the first drain switch into one of the open configuration, and in response to an overload event into the closed configuration, such that:
    when the first drain switch is in its closed configuration, the first drain path presents a low-impedance first discharge path, in electrical parallel to the first feedback capacitor, said first discharge path having a resistance less than the resistance of the first bias resistor; and
  a second drain path coupled in electrical parallel with the second feedback capacitor, the second drain path including a second drain switch controllably configurable between an open configuration and a closed configuration, the second drain switch in control communication with the system reset circuit to receive the control signal from the system reset circuit to controllably configure the second drain switch into one of the open configuration, and in response to an overload event into the closed configuration, such that:
    when the second drain switch is in its closed configuration, the second drain path presents a low-impedance second discharge path, in electrical parallel to the second feedback capacitor, said second discharge path having a resistance less than the resistance of the second bias resistor.

12. A transducer signal processing apparatus comprising:
  means for processing a transducer output signal from a transducer output interface;
  means for sensing, from the transducer output signal, an acoustic overload event from the transducer;
  means for resetting the means for processing the transducer output signal in response to detection of an acoustic overload event,
  wherein the means for processing a transducer output signal comprises a set of capacitances; and wherein
  means for resetting the means for processing the transducer output signal in response to detection of an acoustic overload event comprises a set of drain paths, each drain path controllably switchable in electrical parallel with a corresponding capacitance from the set of capacitances, said drain path draining charge from corresponding capacitance in electrical parallel with said corresponding capacitance, and
  further comprising a timer to controllably switch the set of drain paths into electrical parallel with a corresponding capacitance from the set of capacitances for a predetermined length of time, and thereafter to controllably open set of drain paths to remove each said drain path from being electrical parallel with its corresponding capacitance.

13. The transducer signal processing apparatus of claim 12, wherein the means for sensing an acoustic overload event comprises a comparator having a comparator threshold indicating occurrence of an acoustic overload event, said comparator producing an AOP signal in response to the transducer output signal exceeding the comparator threshold.

* * * * *